US007791435B2

(12) United States Patent
Jamneala

(10) Patent No.: US 7,791,435 B2
(45) Date of Patent: Sep. 7, 2010

(54) SINGLE STACK COUPLED RESONATORS HAVING DIFFERENTIAL OUTPUT

(75) Inventor: Tiberiu Jamneala, San Francisco, CA (US)

(73) Assignee: Avago Technologies Wireless IP (Singapore) Pte. Ltd., Singapore (SG)

(*) Notice: Subject to any disclaimer, the term of this patent is extended or adjusted under 35 U.S.C. 154(b) by 93 days.

(21) Appl. No.: 11/863,720

(22) Filed: Sep. 28, 2007

(65) Prior Publication Data

US 2009/0086654 A1   Apr. 2, 2009

(51) Int. Cl.
*H03H 9/54* (2006.01)
*H03H 9/52* (2006.01)
*H03H 9/70* (2006.01)

(52) U.S. Cl. .................... 333/189; 333/133
(58) Field of Classification Search ............. 333/133, 333/189
See application file for complete search history.

(56) References Cited

U.S. PATENT DOCUMENTS

| 1,100,196 A | 6/1914 | Pettis |
| 1,670,365 A | 5/1928 | Knauss et al. |
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,607,761 A | 9/1971 | Feighner et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandis et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |

(Continued)

FOREIGN PATENT DOCUMENTS

DE   10160617   6/2003

(Continued)

OTHER PUBLICATIONS

K.M. Lakin; "Thin Film BAW Filters For Wide Bandwidth And High Performance Applications"; 2004 IEEE Microwave Symposium Digest; vol. 2, pp. 923-926, Jun. 6-11, 2004.*

(Continued)

*Primary Examiner*—Barbara Summons

(57) ABSTRACT

A coupled acoustic resonator adapted for single-ended input to differential output signal transformation, comprises a single stack. The single stack comprises: a first film bulk acoustic resonator (FBAR) comprising a single-ended input; a second FBAR disposed over the first FBAR comprising a first differential output and a second differential output; an acoustic decoupling layer disposed between the first FBAR and the second FBAR; and a resonant element comprising a resonant inductor and a parasitic capacitor connected in parallel. The resonant element is connected to the first differential output and is operative to substantially balance a signal from the first differential output with a signal from the second differential output. The first differential output is connected to an external circuit comprising a parasitic impedance, and the resonant inductor has an inductance selected to substantially maintain the balance.

17 Claims, 7 Drawing Sheets

U.S. PATENT DOCUMENTS

| | | |
|---|---|---|
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | Mcclanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,705,877 A | 1/1998 | Shimada |
| 5,714,917 A | 2/1998 | Ella |
| 5,789,845 A | 8/1998 | Wadaka et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kiyosumi |
| 6,060,818 A | 5/2000 | Ruby et al. |
| 6,087,198 A | 7/2000 | Panasik |
| 6,107,721 A | 8/2000 | Lakin |
| 6,111,341 A | 8/2000 | Hirama |
| 6,111,480 A | 8/2000 | Iyama et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Toru |
| 6,215,375 B1 | 4/2001 | Larson, III et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Cheng |
| 6,307,447 B1 | 10/2001 | Barber et al. |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Akihiko |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Cheng |
| 6,469,597 B2 | 10/2002 | Ruby et al. |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Ylilammi et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panaski |
| 6,548,943 B2 | 4/2003 | Kaitila et al. |
| 6,550,664 B2 | 4/2003 | Bradley et al. |
| 6,559,487 B1 | 5/2003 | Kang et al. |
| 6,564,448 B1 | 5/2003 | Oura et al. |
| 6,566,956 B2 | 5/2003 | Ohnishi et al. |
| 6,566,979 B2 | 5/2003 | Larson et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,617,249 B2 | 9/2003 | Ruby et al. |
| 6,617,750 B2 | 9/2003 | Dummermuth et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,693,500 B2 | 2/2004 | Yang et al. |
| 6,710,508 B2 | 3/2004 | Ruby et al. |

| | | | | | | |
|---|---|---|---|---|---|---|
| 6,710,681 | B2 | 3/2004 | Figueredo et al. | 7,368,857 B2 | 5/2008 | Tanaka |
| 6,714,102 | B2 | 3/2004 | Ruby et al. | 7,369,013 B2 | 5/2008 | Fazzio et al. |
| 6,720,844 | B1 | 4/2004 | Lakin | 7,388,318 B2 | 6/2008 | Yamada et al. |
| 6,720,846 | B2 | 4/2004 | Iwashita et al. | 7,388,454 B2 | 6/2008 | Ruby et al. |
| 6,724,266 | B2 | 4/2004 | Plazza et al. | 7,388,455 B2 | 6/2008 | Larson, III |
| 6,738,267 | B1 | 5/2004 | Navas Sabater et al. | 7,408,428 B2 | 8/2008 | Larson, III |
| 6,774,746 | B2 | 8/2004 | Whatmore et al. | 7,414,349 B2 | 8/2008 | Sasaki |
| 6,777,263 | B1 | 8/2004 | Gan et al. | 7,414,495 B2 | 8/2008 | Iwasaki et al. |
| 6,787,048 | B2 | 9/2004 | Bradley et al. | 7,425,787 B2 | 9/2008 | Larson, III |
| 6,788,170 | B1 | 9/2004 | Kaitila et al. | 7,439,824 B2 | 10/2008 | Aigner |
| 6,803,835 | B2 | 10/2004 | Frank | 2002/0000646 A1 | 1/2002 | Gooch et al. |
| 6,812,619 | B1 | 11/2004 | Kaitila et al. | 2002/0030424 A1 | 3/2002 | Iwata |
| 6,828,713 | B2 | 12/2004 | Bradley et al. | 2002/0063497 A1 | 5/2002 | Panasik |
| 6,842,088 | B2 | 1/2005 | Yamada et al. | 2002/0121944 A1 | 9/2002 | Larson, III et al. |
| 6,842,089 | B2 | 1/2005 | Lee | 2002/0121945 A1 | 9/2002 | Ruby et al. |
| 6,873,065 | B2 | 3/2005 | Haigh et al. | 2002/0140520 A1* | 10/2002 | Hikita et al. ............ 333/133 |
| 6,873,529 | B2 | 3/2005 | Ikuta | 2002/0152803 A1 | 10/2002 | Larson, III et al. |
| 6,874,211 | B2 | 4/2005 | Bradley et al. | 2002/0190814 A1 | 12/2002 | Yamada et al. |
| 6,874,212 | B2 | 4/2005 | Larson, III | 2003/0001251 A1 | 1/2003 | Cheever et al. |
| 6,888,424 | B2 | 5/2005 | Takeuchi et al. | 2003/0006502 A1 | 1/2003 | Karpman |
| 6,900,705 | B2 | 5/2005 | Nakamura et al. | 2003/0011285 A1 | 1/2003 | Ossmann |
| 6,903,452 | B2 | 6/2005 | Ma et al. | 2003/0051550 A1 | 3/2003 | Nguyen et al. |
| 6,906,451 | B2 | 6/2005 | Hajime | 2003/0087469 A1 | 5/2003 | Ma |
| 6,911,708 | B2 | 6/2005 | Park | 2003/0102776 A1 | 6/2003 | Takeda et al. |
| 6,917,261 | B2 | 7/2005 | Unterberger | 2003/0111439 A1 | 6/2003 | Fetter et al. |
| 6,924,583 | B2 | 8/2005 | Lin et al. | 2003/0128081 A1 | 7/2003 | Ella et al. |
| 6,924,717 | B2 | 8/2005 | Ginsburg et al. | 2003/0132493 A1 | 7/2003 | Kang et al. |
| 6,927,651 | B2 | 8/2005 | Larson, III et al. | 2003/0141946 A1 | 7/2003 | Ruby et al. |
| 6,936,928 | B2 | 8/2005 | Hedler et al. | 2003/0179053 A1 | 9/2003 | Aigner et al. |
| 6,936,954 | B2 | 8/2005 | Peczalski | 2004/0016995 A1 | 1/2004 | Kuo et al. |
| 6,943,648 | B2 | 9/2005 | Maiz et al. | 2004/0056735 A1* | 3/2004 | Nomura et al. ............ 333/133 |
| 6,946,928 | B2 | 9/2005 | Larson et al. | 2004/0092234 A1 | 5/2004 | Pohjonen |
| 6,954,121 | B2 | 10/2005 | Bradley et al. | 2004/0124952 A1 | 7/2004 | Tikka |
| 6,963,257 | B2 | 11/2005 | Ella et al. | 2004/0129079 A1 | 7/2004 | Kato et al. |
| 6,970,365 | B2 | 11/2005 | Turchi | 2004/0150293 A1 | 8/2004 | Unterberger |
| 6,975,183 | B2 | 12/2005 | Aigner et al. | 2004/0150296 A1 | 8/2004 | Park et al. |
| 6,977,563 | B2 | 12/2005 | Komuro et al. | 2004/0195937 A1 | 10/2004 | Matsubara et al. |
| 6,985,052 | B2 | 1/2006 | Tikka | 2004/0212458 A1 | 10/2004 | Lee |
| 6,987,433 | B2 | 1/2006 | Larson et al. | 2004/0257171 A1 | 12/2004 | Park et al. |
| 6,989,723 | B2 | 1/2006 | Komuro et al. | 2004/0257172 A1 | 12/2004 | Schmidhammer et al. |
| 6,998,940 | B2 | 2/2006 | Metzger | 2004/0263287 A1 | 12/2004 | Ginsburg et al. |
| 7,002,437 | B2 | 2/2006 | Takeuchi et al. | 2005/0012570 A1 | 1/2005 | Korden et al. |
| 7,019,604 | B2 | 3/2006 | Gotoh et al. | 2005/0023931 A1 | 2/2005 | Bouche et al. |
| 7,019,605 | B2 | 3/2006 | Larson et al. | 2005/0030126 A1 | 2/2005 | Inoue et al. |
| 7,026,876 | B1 | 4/2006 | Esfandiari et al. | 2005/0036604 A1 | 2/2005 | Scott et al. |
| 7,053,456 | B2 | 5/2006 | Matsuo | 2005/0057117 A1 | 3/2005 | Nakatsuka et al. |
| 7,057,476 | B2 | 6/2006 | Hwu | 2005/0057324 A1 | 3/2005 | Onishi et al. |
| 7,057,478 | B2 | 6/2006 | Korden et al. | 2005/0068124 A1 | 3/2005 | Stoemmer |
| 7,064,606 | B2 | 6/2006 | Louis | 2005/0093396 A1 | 5/2005 | Larson et al. |
| 7,084,553 | B2 | 8/2006 | Ludwiczak | 2005/0093653 A1 | 5/2005 | Larson, III |
| 7,091,649 | B2 | 8/2006 | Larson | 2005/0093654 A1 | 5/2005 | Larson et al. |
| 7,098,758 | B2 | 8/2006 | Wang et al. | 2005/0093655 A1 | 5/2005 | Larson et al. |
| 7,102,460 | B2 | 9/2006 | Schmidhammer et al. | 2005/0093657 A1 | 5/2005 | Larson et al. |
| 7,128,941 | B2 | 10/2006 | Lee | 2005/0093658 A1 | 5/2005 | Larson et al. |
| 7,138,889 | B2 | 11/2006 | Lakin | 2005/0093659 A1 | 5/2005 | Larson et al. |
| 7,161,448 | B2 | 1/2007 | Feng et al. | 2005/0104690 A1 | 5/2005 | Larson |
| 7,170,215 | B2 | 1/2007 | Namba et al. | 2005/0110598 A1 | 5/2005 | Larson, III |
| 7,173,504 | B2 | 2/2007 | Larson | 2005/0128030 A1 | 6/2005 | Larson et al. |
| 7,187,254 | B2 | 3/2007 | Su et al. | 2005/0140466 A1 | 6/2005 | Larson, III et al. |
| 7,209,374 | B2 | 4/2007 | Noro | 2005/0167795 A1 | 8/2005 | Higashi |
| 7,212,083 | B2 | 5/2007 | Inoue et al. | 2005/0193507 A1 | 9/2005 | Ludwiczak |
| 7,212,085 | B2 | 5/2007 | Wu | 2005/0206271 A1 | 9/2005 | Higuchi et al. |
| 7,230,509 | B2 | 6/2007 | Stoemmer | 2005/0218488 A1 | 10/2005 | Mie |
| 7,230,511 | B2 | 6/2007 | Onishi et al. | 2006/0071736 A1 | 4/2006 | Ruby et al. |
| 7,259,498 | B2 | 8/2007 | Nakatsuka et al. | 2006/0081048 A1 | 4/2006 | Mikado et al. |
| 7,275,292 | B2 | 10/2007 | Ruby et al. | 2006/0087199 A1 | 4/2006 | Larson et al. |
| 7,276,994 | B2 | 10/2007 | Takeuchi et al. | 2006/0103492 A1 | 5/2006 | Feng et al. |
| 7,280,007 | B2 | 10/2007 | Feng et al. | 2006/0119453 A1 | 6/2006 | Fattinger et al. |
| 7,281,304 | B2 | 10/2007 | Kim et al. | 2006/0125489 A1 | 6/2006 | Feucht et al. |
| 7,301,258 | B2 | 11/2007 | Masako | 2006/0132262 A1 | 6/2006 | Fazzlo et al. |
| 7,310,861 | B2 | 12/2007 | Aigner et al. | 2006/0164183 A1 | 7/2006 | Tikka |
| 7,332,985 | B2 | 2/2008 | Laqrson et al. | 2006/0185139 A1 | 8/2006 | Larson, III et al. |
| 7,367,095 | B2 | 5/2008 | Larson, III et al. | 2006/0197411 A1 | 9/2006 | Hoen et al. |

| | | | |
|---|---|---|---|
| 2006/0238070 | A1 | 10/2006 | Costa et al. |
| 2006/0284707 | A1* | 12/2006 | Larson et al. ............... 333/187 |
| 2006/0290446 | A1 | 12/2006 | Aigner et al. |
| 2007/0080759 | A1* | 4/2007 | Jamneala et al. ............ 333/191 |
| 2007/0084964 | A1 | 4/2007 | John et al. |
| 2007/0085447 | A1 | 4/2007 | Larson |
| 2007/0085631 | A1 | 4/2007 | Larson et al. |
| 2007/0085632 | A1 | 4/2007 | Larson et al. |
| 2007/0086080 | A1 | 4/2007 | Larson et al. |
| 2007/0086274 | A1 | 4/2007 | Nishimura et al. |
| 2007/0090892 | A1 | 4/2007 | Larson |
| 2007/0170815 | A1 | 7/2007 | Unkrich |
| 2007/0171002 | A1 | 7/2007 | Unkrich |
| 2007/0176710 | A1 | 8/2007 | Jamneala et al. |
| 2007/0205850 | A1 | 9/2007 | Jamneala et al. |
| 2007/0279153 | A1 | 12/2007 | Ruby |
| 2008/0055020 | A1 | 3/2008 | Handtmann et al. |
| 2008/0297279 | A1 | 12/2008 | Thalhammer et al. |
| 2008/0297280 | A1 | 12/2008 | Thalhammer et al. |

FOREIGN PATENT DOCUMENTS

| | | |
|---|---|---|
| EP | 0231892 | 8/1987 |
| EP | 0637875 | 2/1995 |
| EP | 0689254 | 6/1995 |
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |
| EP | 1096259 | 5/2001 |
| EP | 1258990 | 11/2002 |
| EP | 1180494 | 3/2003 |
| EP | 1542362 | 6/2003 |
| EP | 1258989 | 1/2004 |
| EP | 1249932 | 3/2005 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1557945 | 7/2005 |
| EP | 1575165 | 9/2005 |
| EP | 0973256 B1 | 9/2006 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 61054686 | 3/1986 |
| JP | 06005944 | 1/1994 |
| JP | 2002/217676 | 8/2002 |
| JP | 2003/124779 | 4/2003 |
| WO | WO-98/16957 | 4/1998 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

Lakin et al.; "Wide Bandwidth Thin Film BAW Filters"; 2004 IEEE Ultrasonics Symposium; vol. 1, pp. 407-410, Aug. 23-27, 2004.*

U.S. Appl. No. 10/971,169, filed Oct. 22, 2004, Larson, III, John D. et al.

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp.389-400.

Reinhardt, Alexandre et al., "Design of Coupled Resonator Filters Using Admittance and Scattering Matrices", *2003 IEEE Ultrasonics Symposium*, (May 3, 2003), 1428-1431.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoelectric Transformers", *IEEE*, (2001),492-496.

Jiang, Yimin et al., "A Novel Single-Phase Power Factor Correction Scheme", *IEEE*, (1993),287-292.

Ruby, R. C., "Micro-Machined Thin Film Bulk Acoustic Resonators",*Proc. IEEE 48th, Symposium on Frequency control*, (1994), 135-138.

Larson III, J. D., et al., "Measurement of Effective Kt2q,RPRs vs. Temperature for Mo/AlN/Mo Resonators", *2002 IEEE Ultrasonics Symposium*, Munich, Germany, (Oct. 2002),915-919.

Aoyama, T. et al., "Diffusion of Boron, Phosphorous, Arsenic and Antimony in Thermally Grown SiliconDioxide", *Fiujitsu Labs, J. Electromechanical Soc.*, vol. 146, No. 5, (1999), 1879-1883.

Parker, T. E., et al., "Temperature-Compensated Surface Acoustic-Wave Devices with SiO2 Film Overlays", *J. Appl. Physics*, vol. 50, (1360-1369),Mar. 1979.

Tsubbouchi, K. et al., "Zero Temperature coefficient Surface Acoustic Wave Devices using Epitaxial AlN Films", *IEEE Ultrasonic symposium*, San Diaego, CA, 1082 , (1982),240-245.

Lakin, K. M., "Thin Film Resonators and Filters", *IEEE Untrasonics Symposium*, Caesar's Tahoe, NV, (Oct. 1999),895-906.

Lakin, K. M., et al., "Temperature Compensated Bulk Acoustic Thin Film Resonators", *IEEE Ultrasonics Symposium*, San Juan, Puerto Rico, (Oct. 2000),855-858.

Ohta, S. et al., "Temperature Characteristics of Solidly Mounted Piezoelectric Thin Film Resonators", *IEEE Ultrasonics Symposium*, Honolulu, HI, (Oct. 2003),2011-2015.

Bauer, L. O., et al., "Properties of Silicon Implanted with Boron Ions through Thermal Silicon Dioxide", *Solid State Electronics*, vol. 16, No. 3, (Mar. 1973),289-300.

Topich, J. A., et al., "Effects of Ion Implanted Flourine in Silicon Dioxide", *Nuclear Instr. And Methods, Cecon Rec*, Cleveland, OH, (May 1978),70-73.

Spangenberg, B. et al., "Dependence of the Layer Resistance of Boron Implantation in Silicon and the Annealing Conditions", *Comptus Rendus de l'Academic Bulgare des Sciences*, vol. 33, No. 3, (1980),325-327.

Hara, K. "Surface Treatment of Quartz Oscillator Plate by Ion Implantation", *Oyo Buturi*, vol. 47, No. 2, (Feb. 1978),145-146.

Ng, J. et al., "The Diffusion Ion-Implanted Boron in Silicon Dioxide", *AIP Conf. Proceedings*, No. 122, (1984),20-33.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials For BAW Resonators And Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

Jung, Jun-Phil et al., "Experimental And Theoretical Investigation On The Relationship Between AlN Properties and AlN-Based FBAR Characteristics", *2003 IEEE International Frequency Control Symposium and PDA Exhibition Jointly with the 17th European Frequency and Time Forum*, (Sep. 3, 2003), 779-784.

Yang, C.M. et al., "Highly C Axis Oriented AlN Film Using MOCVD For 5GHx Band FBAR Filter", *2003 IEEE Ultrasonics Symposium*, (Oct. 5, 2003),pp. 170-173.

Martin, Steven J., et al., "Development Of A Low Dielectric Constant Polymer For The Fabrication Of Integrated Circuit Interconnect", *12 Advanced Materials*, (Dec. 23, 2000),1769-1778.

Hadimioglu, B. et al., ""Polymer Films As Acoustic Matching Layers".", *1990 IEEE Ultrasonics Symposium Proceedings*, vol. 3 PP., [Previously submitted as "Polymer Files As Acoustic Matching Layers, 1990 IEEE Ultrasonics Symposium Proceeding. vol. 4 pp. 1227-1340, Dec. 1990". (Dec. 1990), 1337-1340.

"Search Report from corresponding application No.", GB 0605779.8, (Aug. 23, 2006).

"Examination Report from UK for application", GB 0605971.1, (Aug. 24, 2006).

"Examination report corresponding to application No.", GB0605770.7, (Aug. 25, 2006).

"Examination Report corresponding to application No.", GB0605775.6, (Aug. 30, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

Coombs, Clyde F., et al., "Electronic Instrument Handbook", *Second Edition, Mc-Graw-Hill, Inc.*, (1995),pp. 5.1 to 5.29.

"A GB Search Report for", Application No. GB0522393.8, (Jan. 9, 2006),4 pages.

"A GB Search Report for Application No.", GB0525884.3, (Feb. 2, 2006),4 pgs.

Auld, B. A., "Acoustic Resonators", *Acoustic Fields and Waves in Solids, Second Edition*, vol. II, (1990),250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys. 54* (10) (Oct. 1983),5893-5910.

"Search Report from corresponding application", No. GB0605225.2, (Jun. 26, 2006).

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britian Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", *0/7803-8331-1/4/W20.00; IEEE MTT-S Digest*, (2004),927-929.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Pang, W. et al., "High Q Single-Mode High-Tone Bulk Acoustic Resonator Integrated With Surface-Machined FBAR Filter", *Microwave Symposium Digest, IEEE MTT-S International*, (2005),413-416.

Sanchez, A.M. et al., "Mixed analytical and numerical design method for piezoelectric transformers", *IEEE,PESX* Jun. 2003 , 841-846.

Vasic, D et al., "A New Method to Design Piezoelectic Transformer Used in MOSFET & IGBT Drive Circuits", *IEEE 34th Anuual Power Electronics Specialists Conference*, 2003, vol. 1 Jun. 15-19, 2003 , 307-312.

Vasic, D et al., "A New MOSFET & IGBT Gate Drive Insulated By A Piezoelectric Transformer", *IEEE 32 nd Annual Power Electronics Specialists Conference*, 2001, vol. 3 2001, 1479-1484.

\* cited by examiner

100

200

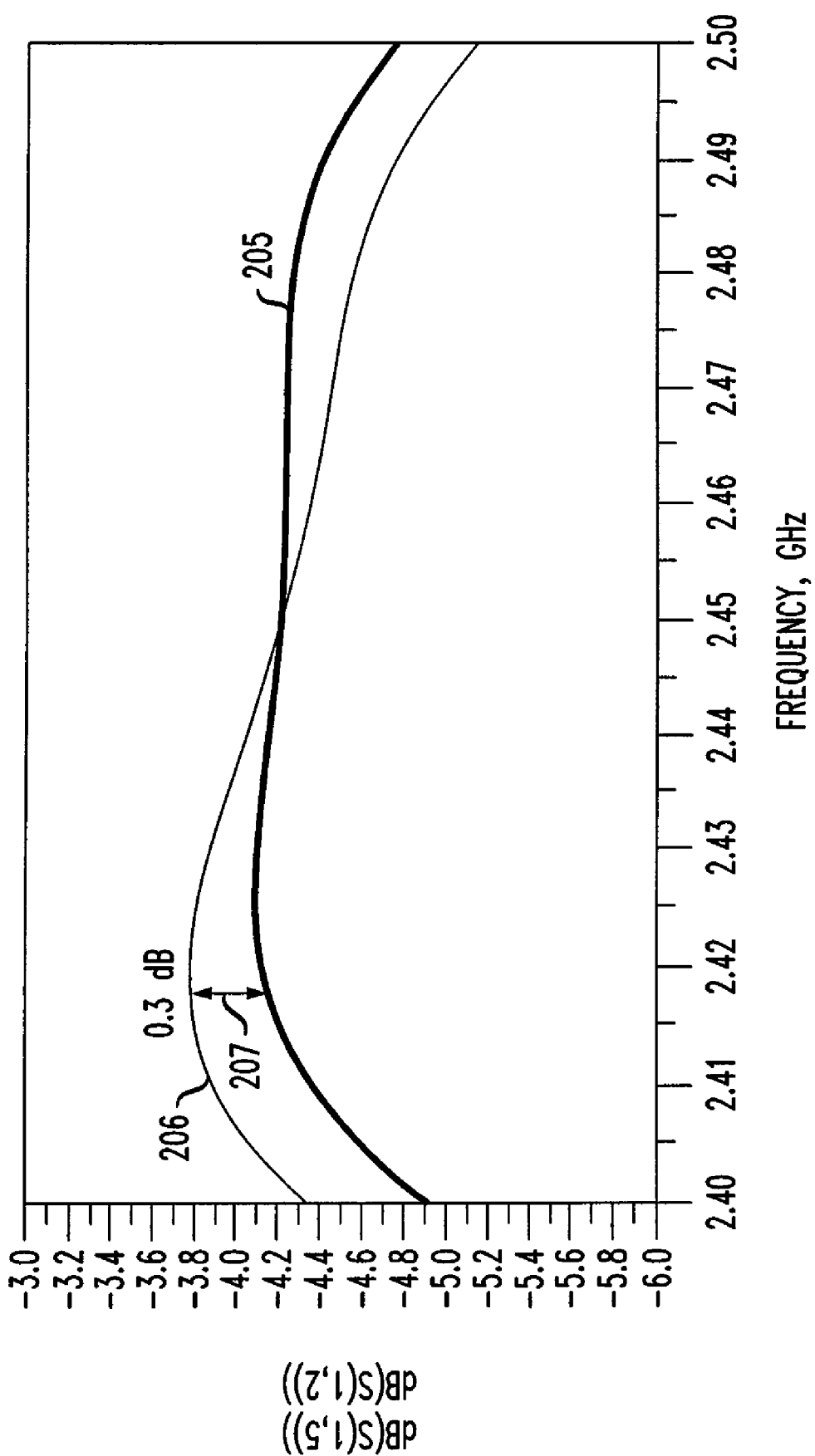

300

SINGLE STACK COUPLED RESONATORS HAVING DIFFERENTIAL OUTPUT

BACKGROUND

In many applications, a common signal path is coupled both to the input of a receiver and to the output of a transmitter. For example, in a transceiver, such as a cellular or cordless telephone, an antenna may be coupled to the input of the receiver and to the output of the transmitter. In such an arrangement, a duplexer is used to couple the common signal path to the input of the receiver and to the output of the transmitter. The duplexer provides the necessary coupling while preventing the modulated transmit signal generated by the transmitter from being coupled from the antenna back to the input of the receiver and overloading the receiver.

Often, among other elements, resonators are used to prevent the undesired coupling of these signals. One type of filter is based on a film bulk acoustic resonator (FBAR) structure. The FBAR includes an acoustic stack comprising a layer of piezoelectric material disposed between two electrodes. Acoustic waves achieve resonance across the acoustic stack, with the resonant frequency of the waves being determined by the materials in the acoustic stack.

FBARs are similar in principle to bulk acoustic resonators such as quartz, but are scaled down to resonate at GHz frequencies. Because the FBARs have thicknesses on the order of microns, and length and width dimensions of hundreds of microns, FBARs beneficially provide a comparatively compact alternative to known resonators.

More and more there is a need for differential signal applications from a single ended input. This has led to the investigation of alternative filter arrangements.

One way of providing a single-ended to differential signal transformation in a filter application involves a device known as a balun. For example, the balun may be connected to an FBAR-based filter. Unfortunately, and among other drawbacks, the use of a balun adds another (external) element to circuit, driving the cost and size of the filter up.

One known resonator structure having a differential output comprises coupled mode resonators. Coupled mode resonators often comprise an upper FBAR and a lower FBAR, with a layer of acoustic decoupling material between the two FBARs. The two electrodes of one of the FBARs comprise the differential outputs, and one of the inputs to the lower resonator provides the single-ended input. The second electrode provides the ground for the device.

While the noted structure is beneficial in providing a single-ended to differential signal transformation device, a parasitic capacitance is formed by the ground electrode, the decoupling layer and one of the differential output electrodes. The net result is an unacceptable amplitude imbalance, or phase imbalance, or both between the differential outputs. Thus, the parasitic capacitance, as well as other parasitic components that can be external to the differential output resonator, can have a deleterious impact on the function of the differential resonator.

There is a need, therefore, for a single-ended input to differential output filter that overcomes at least the shortcoming of known filters discussed above.

SUMMARY

In a representative embodiment, a coupled acoustic resonator adapted for single-ended input to differential output signal transformation, comprises a single stack. The single stack comprises: a first film bulk acoustic resonator (FBAR) comprising a single-ended input; a second FBAR disposed over the first FBAR comprising a first differential output and a second differential output; an acoustic decoupling layer disposed between the first FBAR and the second FBAR; and a resonant element comprising a resonant inductor and a parasitic capacitor connected in parallel. The resonant element is connected to the first differential output and operative to substantially balance a signal from the first differential output with a signal from the second differential output. The first differential output is connected to an external circuit comprising a parasitic impedance, and the resonant inductor has an inductance selected to substantially maintain the balance In another representative embodiment, a communication device comprises a transmitter; a receiver; and a single stack coupled resonator filter (CRF). The CRF comprises a first film bulk acoustic resonator (FBAR) comprising a single-ended input; a second FBAR disposed over the first FBAR comprising a first differential output and a second differential output; an acoustic decoupling layer disposed between the first FBAR and the second FBAR; and a resonant element comprising a resonant inductor and a parasitic capacitor connected in parallel. The resonant element is connected to the first differential output and operative to balance substantially a signal from the first differential output with a signal from the second differential output. The first differential output is connected to an external circuit comprising a parasitic impedance, and the resonant inductor has an inductance selected to substantially maintain the balance In another representative embodiment, an electronic device comprises a transmitter; a receiver; and a single stack coupled resonator filter (CRF). The CRF comprises a first film bulk acoustic resonator (FBAR) comprising a single-ended input; a second FBAR disposed over the first FBAR comprising a first differential output and a second differential output; an acoustic decoupling layer disposed between the first FBAR and the second FBAR; and a resonant element comprising a resonant inductor and a parasitic capacitor connected in parallel. The resonant element is connected to the first differential output and operative to balance substantially a signal from the first differential output with a signal from the second differential output. The first differential output is connected to an external circuit comprising a parasitic impedance, and the resonant inductor has an inductance selected to substantially maintain the balance.

In another representative embodiment, a coupled acoustic resonator adapted for single-ended to differential signal transformation, comprises a single stack. The single stack comprises: a first film bulk acoustic resonator (FBAR) comprising a single-ended input; a second FBAR disposed over the first FBAR comprising a first differential output and a second differential output; an acoustic decoupling layer disposed between the first FBAR and the second FBAR; and a resonant element comprising a resonant inductor and the parasitic capacitor connected in parallel. The resonant element is connected to the first differential output and is operative to substantially balance a signal from the first differential output with a signal from the second differential output. The second differential output is connected to an external circuit comprising a parasitic impedance; and the resonant inductor has an inductance selected to substantially maintain the balance.

In another representative embodiment, a communication device, comprises: a transmitter; a receiver; and a single stack coupled resonator filter (CRF), adapted for single-ended to differential signal transformation. The CRF comprises: a first film bulk acoustic resonator (FBAR) comprising a single-ended input; a second FBAR disposed over the first FBAR comprising a first differential output and a second differential output; an acoustic decoupling layer disposed between the first FBAR and the second FBAR; and a resonant element comprising a resonant inductor and a parasitic capacitor connected in parallel. The resonant element is connected to the first differential output and operative to balance substantially a signal from the first differential output with a signal from the second differential output. The second differential output is connected to an external circuit comprising a parasitic impedance, and the resonant inductor has an inductance selected to substantially maintain the balance.

In another representative embodiment, a coupled acoustic resonator adapted for single-ended to differential signal transformation comprises a single stack. The single stack comprises: a first film bulk acoustic resonator (FBAR) comprising a single-ended input; a second FBAR disposed over the first FBAR comprising a first differential output and a second differential output; an acoustic decoupling layer disposed between the first FBAR and the second FBAR; and a resonant element connected to the first differential output and operative to substantially balance a signal from the first differential output with a signal from the second differential output. An S parameter of the signal of the first differential output and an S parameter of the signal of the second differential output have a differential of less than approximately 1.0 dB to approximately 0.3 dB.

In another representative embodiment, a communication device, comprises: a transmitter; a receiver; and a single stack coupled resonator filter (CRF), adapted for single-ended to differential signal transformation. The CRF comprises: a first film bulk acoustic resonator (FBAR) comprising a single-ended input; a second FBAR disposed over the first FBAR comprising a first differential output and a second differential output; an acoustic decoupling layer disposed between the first FBAR and the second FBAR; and a resonant element connected to the first differential output and operative to balance substantially a signal from the first differential output with a signal from the second differential output. An S parameter of the signal of the first differential output and an S parameter of the signal of the second differential output have a differential of less than approximately 1.0 dB to approximately 0.3 dB.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

FIG. 2C is a graphical representation of output amplitude of differential signal ports of a coupled acoustic resonator of a representative embodiment.

DEFINED TERMINOLOGY

As used herein, the terms 'a' or 'an', as used herein are defined as one or more than one.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Representative embodiments are described in the context of acoustic resonator filters. The acoustic resonator filters of the embodiments comprise single-ended to differential signal transformation acoustic resonator filters. These filters are useful, for example, in duplex and multiplex communications. For instance, duplex communications architectures such as described in commonly assigned U.S. Pat. No. 6,262,637, entitled "Duplexer Incorporating thin-film bulk acoustic resonators (FBARs)" to Bradley, et al. may benefit from filters comprising resonators of the representative embodiments. The disclosure of this patent is specifically incorporated herein by reference.

Moreover, and as will become clearer as the present description continues, a filter having the stacked FBAR structure having an acoustically decoupling layer between FBARs have certain features common to those described in commonly owned U.S. Pat. No. 7,019,605 to Bradley, et al. and entitled "Stacked Bulk Acoustic Resonator Band-Pass Filter with Controllable Bandpass." The disclosure of this patent is specifically incorporated herein by reference.

It is emphasized that the application of the present teachings to filters is intended merely to illustrative. More generally, the decoupled resonator structures of the present teachings are applicable to a wide range of electronic devices, components and circuits (e.g., oscillators, transformers and mixers). Such applications will likely become more apparent to one of ordinary skill in the art having had the benefit of the present disclosure.

Figure 1A:
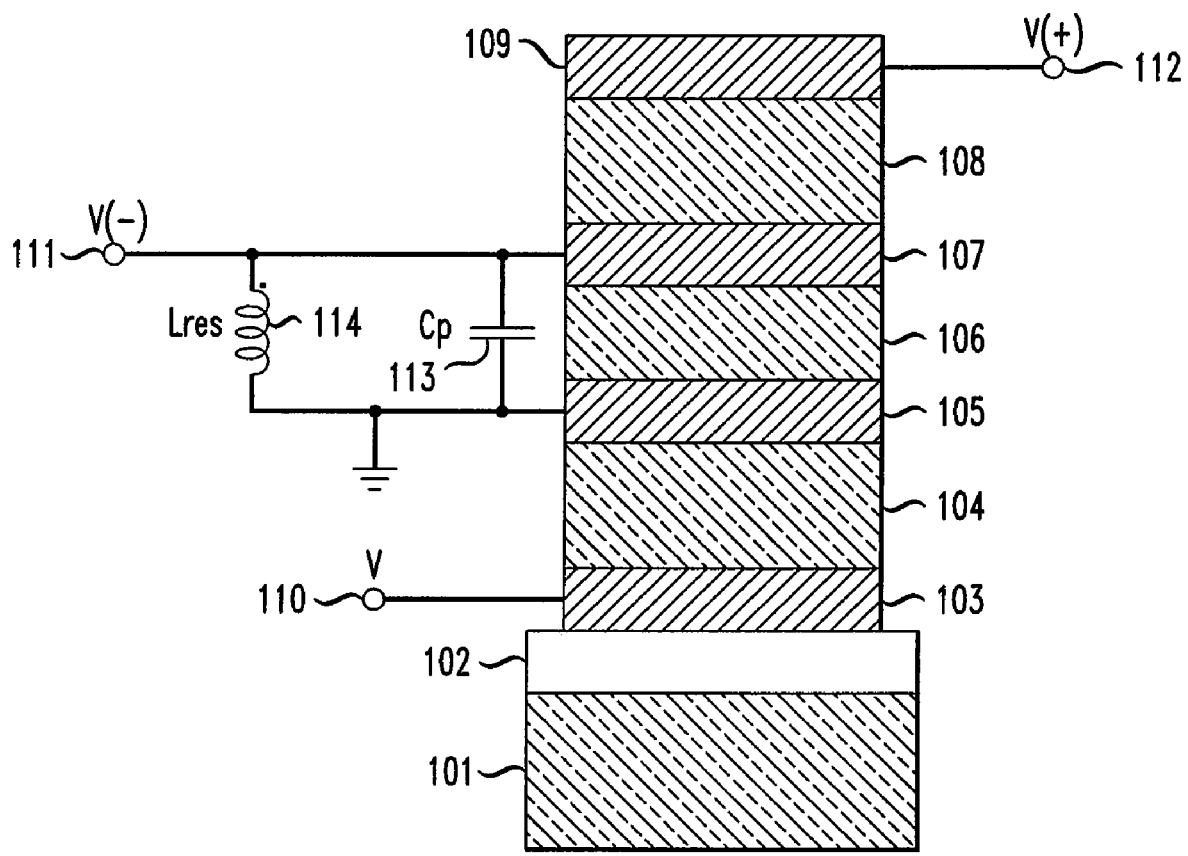
FIG. 1A is a simplified schematic view of a coupled acoustic resonator in accordance with a representative embodiment.

FIG. 1A is a cross-sectional view of an acoustic coupled resonator filter 100 in accordance with a representative embodiment. The resonator filter 100 comprises a single-stack structure disposed over a substrate 101. The single stack 100 comprises a first FBAR comprising a lower electrode 103 disposed over a cavity or reflector (e.g., a mismatched acoustic Bragg reflector) 102. Details of the cavity 102 and its fabrication may be found in commonly owned U.S. Pat. No. 6,107,721, to Lakin the disclosure of which is specifically incorporated into this disclosure by reference in its entirety. Moreover, the cavity 102 may be fabricated according to known semiconductor processing methods and using known materials. Illustratively, the cavity 102 may be fabricated according to the teachings of U.S. Pat. Nos. 5,587,620, 5,873, 153 and 6,507,983 to Ruby, et al. The disclosures of these patents are specifically incorporated herein by reference. It is emphasized that the methods described in these patents are representative and other methods of fabrication and materials within the purview of one of ordinary skill in the art are contemplated.

The single stack also comprises a piezoelectric layer 104 disposed over the lower electrode 103 and an upper electrode 105 is disposed over the layer 104. A decoupling layer 106 is disposed over the upper electrode 105. The single stack also comprises a second FBAR, which comprises a lower electrode 107, a piezoelectric layer 108 and an upper electrode 109.

The resonator filter 100 provides single-ended to differential signal transformation. In particular, a single-ended input 110 is connected to the lower electrode 103, and a ground connection is made to the upper electrode 105 of the first FBAR. Moreover, a first differential output 111 is connected to the first electrode 107 of the second FBAR; and a second differential output 112 is connected to the upper electrode of the second FBAR. Many of the details of the single stack single-ended to differential signal transformation resonator filter of the representative embodiments may be found in commonly owned U.S. Patent Publication 20070176710 to Jamneala, et al., the disclosure of which is specifically incorporated herein by reference. As such, many details are not repeated to avoid obscuring the description of the representative embodiments.

In the representative embodiment, an input signal (V) is applied to the single-ended input 110, resulting in an output signal $V^-$ at the first differential output 111; and an output signal $V^+$ at the second differential output 112 of the resonator filter 100, where the differential output signals are 180° are out of phase. Notably, the sign convention of the voltages (+/−) shown is merely illustrative and of course, depends on the piezoelectric materials selected for the filters (e.g., the direction of the c-axes) and the selected ground connection. Moreover, and as will be appreciated by one of ordinary skill in the art, and as will become clearer as the present description continues, terms 'input' and 'output' are interchangeable depending on the signal direction. A signal is provided at the input 110. The filtered signal is provided to differential outputs 111 and 112, which are connected to circuits of a prescribed impedance. Accordingly, a single-ended signal is input at the filter 100 and is transformed to a balanced differential signal at the outputs 111, 112. Naturally, input of a differential signal to the 'outputs' 111, 112 provides a filtered single-ended signal at the 'input' 110.

With the upper electrode 105 at ground and the lower electrode 107 at a non-zero voltage, the upper electrode 105 of the first FBAR, the decoupling layer 106 and the lower electrode 107 of the second FBAR, comprise a parasitic capacitor ($C_p$) 113. As described more fully herein, in accordance with a representative embodiment, a resonant inductor ($L_{res}$) 114 is provided in parallel with the capacitor 113. The parallel capacitor 113 and the resonant inductor 114 constitute a resonant element of a representative embodiment. The resonant element is adapted to maintain the amplitudes of the output signals of the differential outputs balanced.

As will be appreciated, without correction of the resonant inductor 114, the parasitic capacitor 113 results in a load at the output 111. Although the relation $V=V^+ - V^-$ is maintained, when the differential outputs 111, 112 are connected to outputs of the same impedance (e.g., a 50 Ω line or device), the voltage $V^-$ at the lower electrode 107 is lowered as a result of the load from $C_p$. Ultimately, this results in an amplitude imbalance of signals at the differential outputs 111, 112.

Figure 1B:
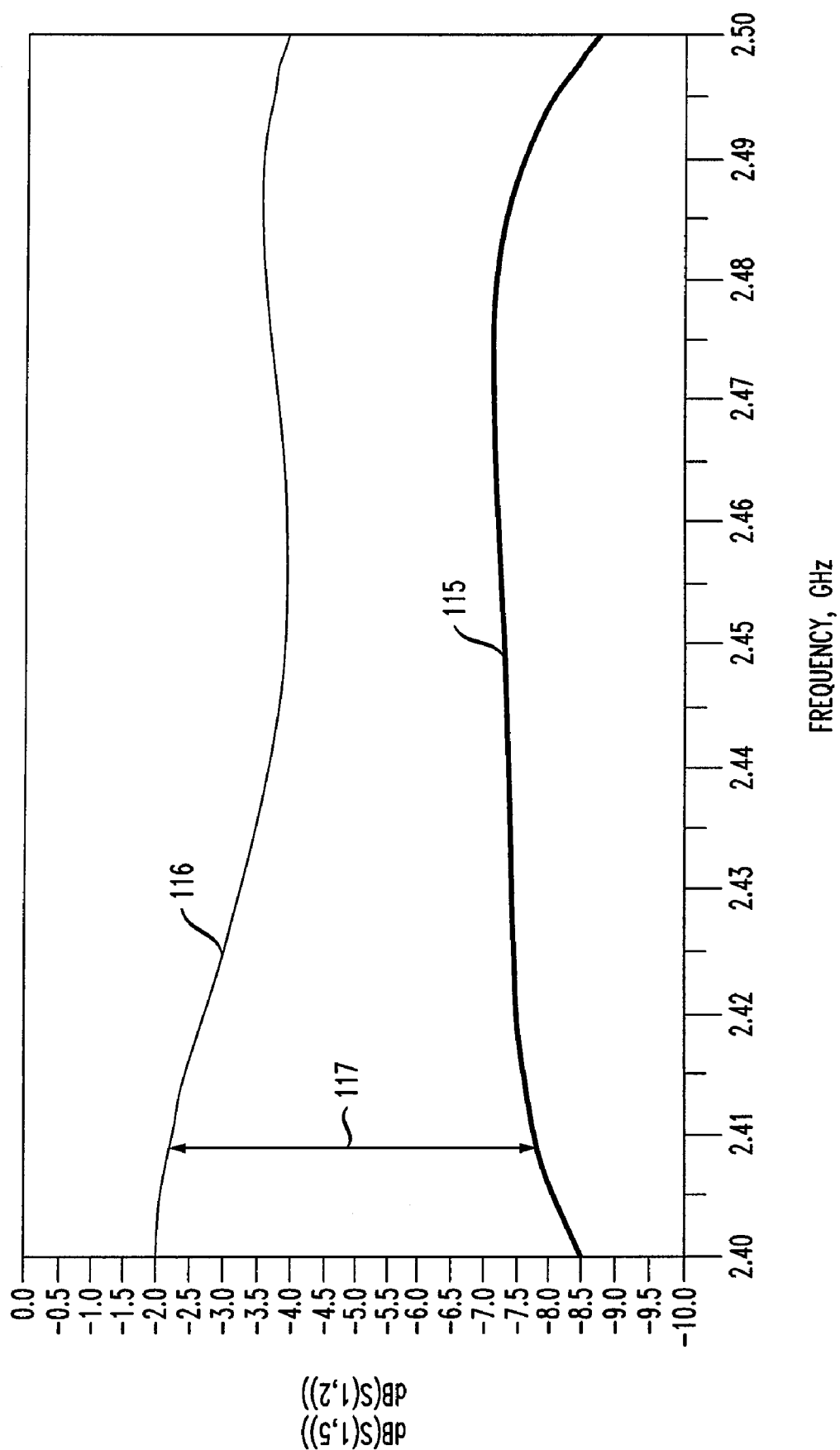
FIG. 1B is a graphical representation of the amplitude imbalance of differential signal ports of a known coupled acoustic resonator.

The lowering of the output voltage from the first differential output 111 is shown graphically in FIG. 1B, which is a graphical representation of the germane S parameters versus frequency of a known resonator. In particular, the S parameter at the output of the first differential output (without correction), $S_{1.5}$, is shown as curve 117. By contrast, the output parameter at the second differential output (again without correction), $S_{1.2}$, is shown as curve 116; and the difference 117 is shown to vary with frequency. Unfortunately, over the frequency range of interest, the magnitude of the difference 117 can be as great as approximately −6.5 dB and only as slight as −3.5 dB. Regardless, output differential specifications ($ABS(S_{1.5}-S_{1.2})$) are on the order of less than 1.0 dB for many communications applications.

Figure 1C:
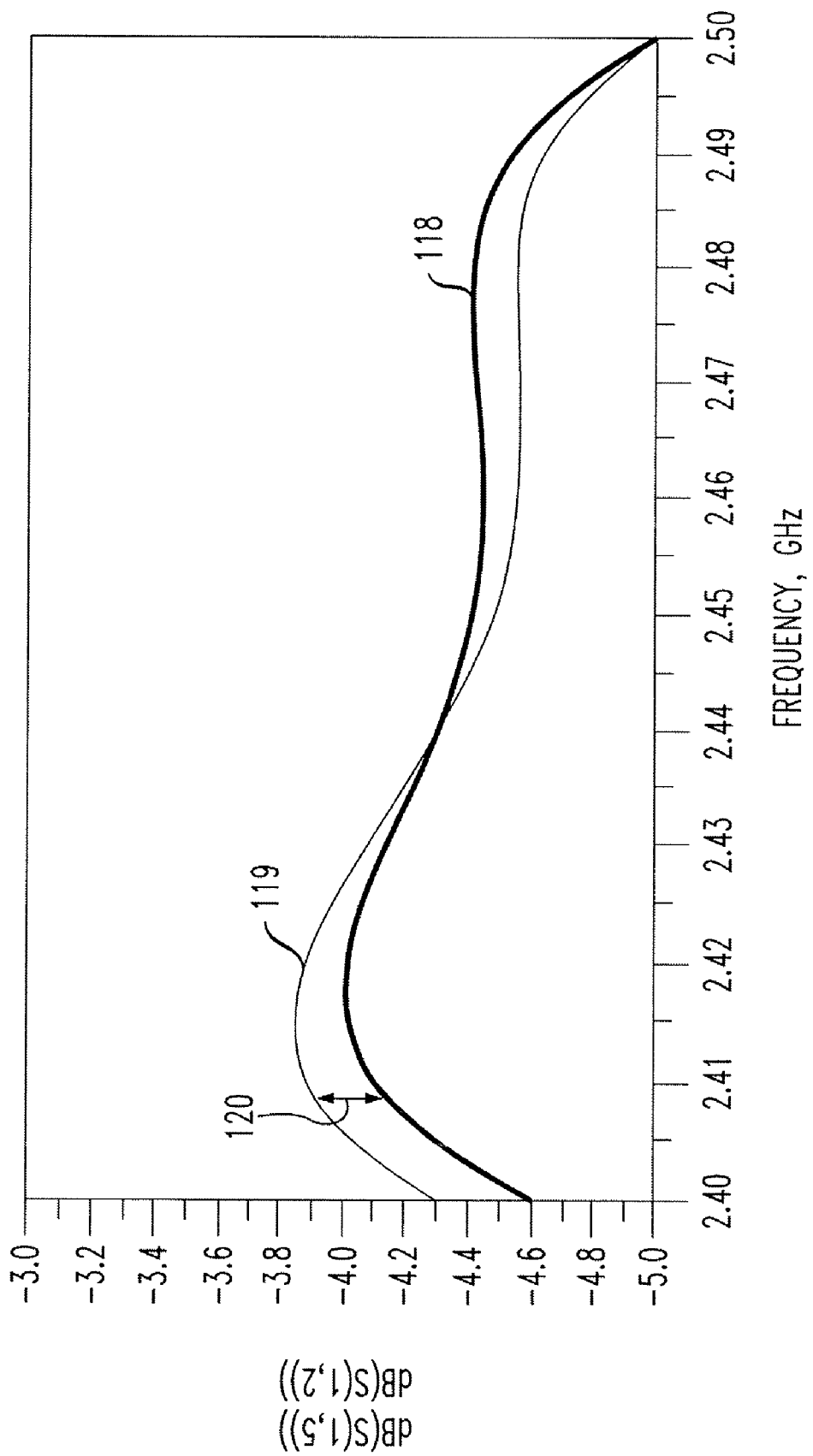
FIG. 1C is a graphical representation of output amplitude of differential signal ports of a coupled acoustic resonator of a representative embodiment.

By contrast, FIG. 1C shows the S-parameters of a filter 100 of a representative embodiment and including the resonant element comprising the capacitor 113 and the inductor 114 over the same frequency range of interest. In the present embodiment, the curve 118 of $S_{1.5}$ has a substantially greater magnitude (i.e., the amplitude of the output signal is greater) compared to curve 115. Moreover, $ABS(S_{1.5}-S_{1.2})$ of a difference 120 between curve 118 and curve 19 ($S_{1.2}$) is 0.3 dB or less over the frequency range of interest.

The inductor 114 is selected so that the resonant element is at or near resonance over the frequency range of operation of the filter 100. As such, over this range, the resonant element is, in essence, an infinite impedance in parallel with the output impedance at the port comprising the differential output 111. Accordingly, little current flows into the resonant element and load created by the parasitic capacitor 113 is substantially nullified.

Figure 2A:
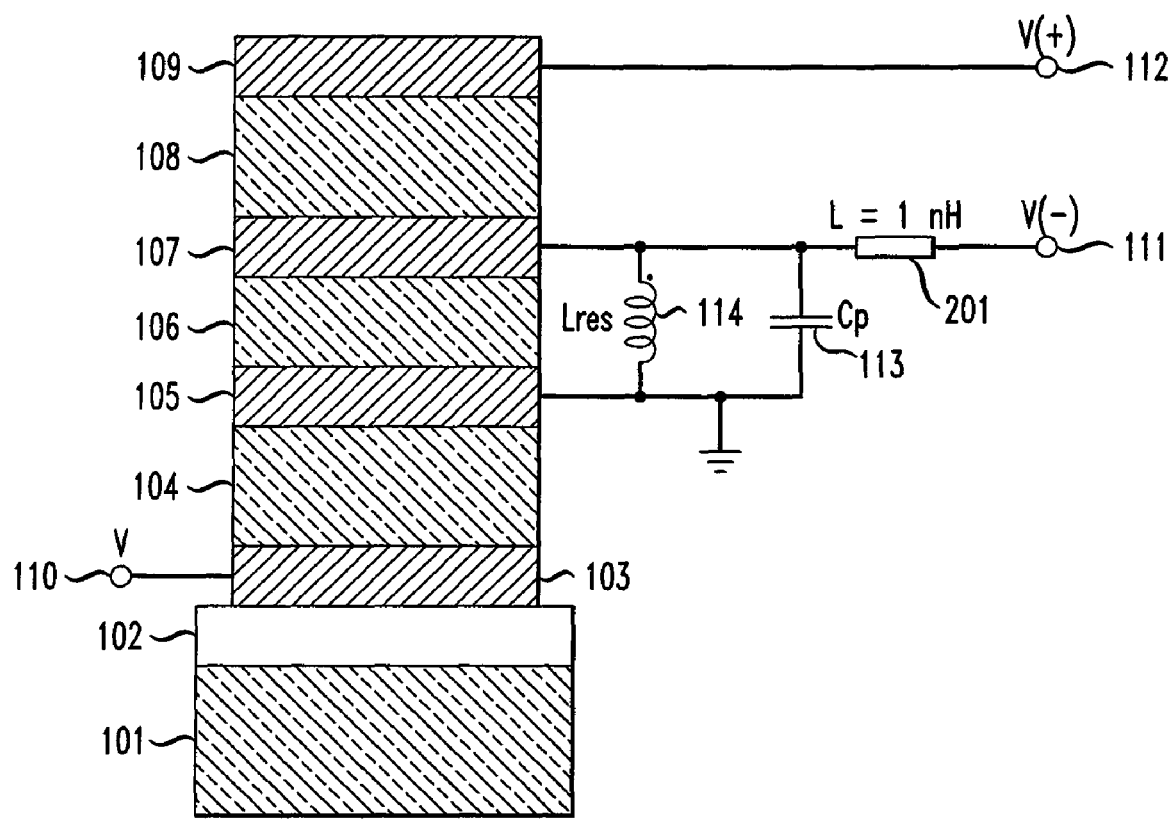
FIG. 2A is a simplified schematic view of a coupled acoustic resonator in accordance with a representative embodiment.

FIG. 2A is a simplified schematic view of a coupled acoustic resonator filter 200 in accordance with a representative embodiment. As many of the details of the resonator 200 are common to those described in connection with the embodiments of FIG. 1A, such details are omitted to avoid obscuring the description of the present embodiments.

Ideally, the differential outputs 111, 112 experience an output impedance that is substantially identical. However, and particularly at the comparatively high frequencies of operation of the circuits in which the filter 200 is deployed, parasitic impedance elements (perturbations) can manifest from a variety of sources. These parasitic impedance elements are often manifest as a parasitic inductors, but may be parasitic capacitors, or both. These parasitic impedance elements may result from circuit defects (e.g., unequal circuit trace length or thickness). Regardless of their source, because of the parasitic impedance elements, the output impedance of the electrodes 107, 108 are unbalanced and the resulting signal amplitudes (S-parameters) are unbalanced. As explained in connection with FIGS. 1A-1C, specifications mandate that the S-parameters be within a prescribed differential.

The parasitic impedance element may be connected to electrode 107, or electrode 109, or both. In the interest of simplicity of description, a specific element in the output signal path of electrode 107 will be described. Naturally, the principles of correcting the imbalance this element creates are applicable to other types of impedance elements and to elements in the output signal path of electrode 109.

In the present embodiment, a parasitic inductor (L) 201 is in the output path of the electrode 107. Without inductor 201, the resonant element comprising the parasitic capacitor 113 and resonant inductor 114, function at or near resonance for the selected operating frequency range of the filter 200. However, the external parasitic impedance of the inductor 201 alters the output impedance of the output path of the electrode 107. In operation, this alters the voltage at the electrode 107. In particular, and based on the voltages at the electrodes of the filter, current flows from the upper electrode 109 through the piezoelectric layer 108 to the lower electrode 107. Current through the series inductor L 201 causes a voltage drop across the inductor 201, resulting in an increase in the voltage at electrode 107. As such, the voltage at electrode 108 is increased and the voltage balance between the electrodes 107, 109 is compromised.

Figure 2B:
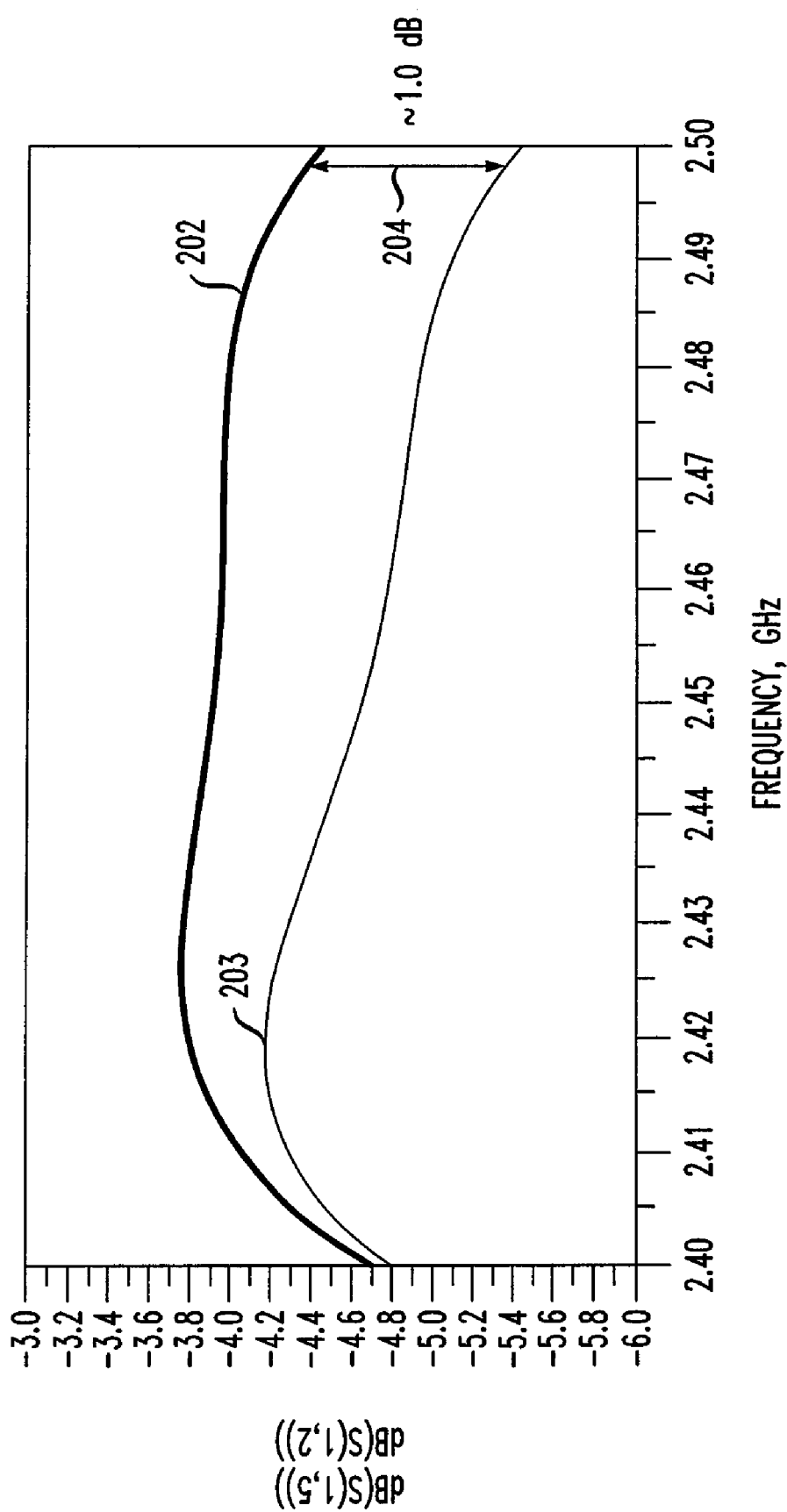
FIG. 2B is a graphical representation of the amplitude imbalance of differential signal ports of a known coupled acoustic resonator.

FIG. 2B shows $S_{1,5}$ and $S_{1,2}$ resulting from the addition of the perturbation caused by inductor 201. As expected, $S_{1,5}$, shown as curve 202, is increased due to the increased voltage on electrode 107, compared to $S_{1,2}$, shown as curve 203. Moreover, the differential 204 between curves 202, 203, which represents the imbalance of the outputs due to the perturbation is as great as 1.0 dB at a certain frequency. With the specification that the imbalance be less than 1.0 dB, mitigation of the imbalance is effected in the present embodiment by altering the value of the resonance inductor 114.

In the representative embodiment, the resonance inductor 114 functions as a shunt inductor. By reducing the value of the inductor 114, greater current flow across the shunt is realized, and the voltage drop across the shunt is comparatively increased. Therefore, the voltage at electrode 107 is reduced. By careful selection of the inductance of inductor 114, the voltages (S-parameters) at the electrodes 107, 109 can be brought closer to a balanced condition and the S-parameters at the outputs 111, 112 are thus brought closer to a balanced condition. Stated differently, by modifying the inductance of the resonant inductor 114, the S-parameters can experience a reduced differential across the frequency range of interest. This is shown in FIG. 2C where curve where curve 205 represents $S_{1,5}$ and curve 206 represents $S_{1,2}$. Illustratively, the reducing of resonance inductor 114 results in a difference 207 that is at most 0.3 dB over the frequency range of interest.

As noted, the parasitic inductance or other perturbations can be coupled to between the differential output 112 and the electrode 109. In this case, and again given the current flow and voltage polarities shown in FIG. 2A, the voltage at the electrode 107 will be reduced. By similar analysis, this change in voltage can be corrected by a change in the inductance in the resonance inductor 114. In the present case, an increase in the inductance is needed. This decreases the current across the shunt and consequently increases the voltage at the electrode 107. Thus, the resonance inductor 114 provides the tuning of the voltage at electrode 107 and thus beneficially restores the balance between the electrodes 107, 109 and thus the differential outputs 111, 112.

Figure 3:
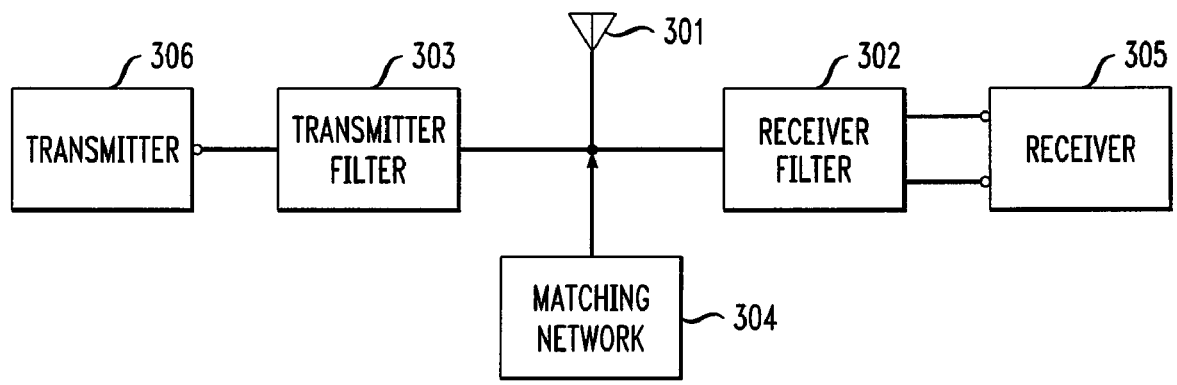
FIG. 3 is a simplified schematic view of a duplex communications device in accordance with a representative embodiment.

FIG. 3 is a simplified schematic block diagram of a communication device 300 in accordance with a representative embodiment. The communication device 300 may be, for example, a cellular phone or similar device adapted for full duplex communication. The device 300 includes an antenna 301, which is connected to a receiver filter 302 and a transmitter filter 303. An impedance matching network 304 is provided to facilitate the single-ended to differential signal transformation to and from the antenna 301. Notably, the matching network may be provided directly in the acoustic resonator filter, although this is not essential and other known matching networks may be used.

The transmitter filter 303 connects the antenna to a transmitter 306 and includes a single-ended filter having a passband selected to correspond to the passband of the transmitter of the communication device 300. The transmitter filter 303 may be an acoustic resonator filter such as described above.

The receiver filter 302 connects the antenna to the receiver 306 and includes a hybrid acoustic resonator filter such as described above. The hybrid acoustic resonator filter provides the desired passband and nearband rejection desired for a single-ended input signal to a differential output signal to the receiver 306. The receiver filter comprises an acoustic resonator filter 100 or 200 describe previously.

In view of this disclosure it is noted that the various acoustic resonator filters described herein can be implemented in a variety of materials and variant structures. Moreover, applications other than resonator filters may benefit from the present teachings. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. A coupled acoustic resonator adapted for single-ended to differential signal transformation, comprising a single stack, the single stack comprising:
a first film bulk acoustic resonator (FBAR) comprising a single-ended input;
a second FBAR disposed over the first FBAR comprising a first differential output and a second differential output;
an acoustic decoupling layer disposed between the first FBAR and the second FBAR; and
a resonant element comprising a resonant inductor and a parasitic capacitor connected in parallel, the resonant element being connected to the first differential output and operative to substantially balance a signal from the first differential output with a signal from the second differential output, wherein the first differential output is connected to an external circuit comprising a parasitic impedance, and the resonant inductor has an inductance selected to substantially maintain the balance.

2. A coupled acoustic resonator as claimed in claim 1, wherein the resonant inductor is connected between the first differential output and a ground.

3. A coupled acoustic resonator as claimed in claim 1, wherein the parasitic capacitor comprises the acoustic decoupling layer, an upper electrode of the first FBAR and a lower electrode of the second FBAR.

4. A coupled acoustic resonator as claimed in claim 1, wherein the resonant element has a passband selected substantially to match a passband of the resonator.

5. A coupled acoustic resonator as claimed in claim 1, wherein the parasitic impedance comprises a parasitic inductor, and the parasitic inductor is connected in series with a tank circuit comprising the parasitic capacitor and the resonant inductor.

6. A coupled acoustic resonator as claimed in claim 1, wherein the coupled acoustic resonator is a coupled resonator filter (CRF).

7. A communication device, comprising:
a transmitter;
a receiver; and
a single stack coupled resonator filter (CRF), adapted for single-ended to differential signal transformation, the CRF comprising:
a first film bulk acoustic resonator (FBAR) comprising a single-ended input;
a second FBAR disposed over the first FBAR comprising a first differential output and a second differential output;
an acoustic decoupling layer disposed between the first FBAR and the second FBAR; and
a resonant element comprising a resonant inductor and a parasitic capacitor connected in parallel, the resonant element being connected to the first differential output and operative to substantially balance a signal from the first differential output with a signal from the second differential output, wherein the first differential output is connected to an external circuit comprising a parasitic impedance; and the resonant inductor has an inductance selected to substantially maintain the balance.

8. A communication device as claimed in claim 7, wherein the parasitic impedance comprises a parasitic inductor, and the parasitic inductor is connected in series with a tank circuit comprising the parasitic capacitor and the resonant inductor.

9. A communications device as claimed in claim 7, wherein the resonant inductor is connected between the first differential output and a ground.

10. A communications device as claimed in claim 7, wherein the parasitic capacitor comprises the acoustic decoupling layer, an upper electrode of the first FBAR and a lower electrode of the second FBAR form a parasitic capacitor.

11. A communications device as claimed in claim 7, wherein an S parameter of the signal of the first differential output and an S parameter of the signal of the second differential output have a differential of less than approximately 1.0 dB to approximately 0.3 dB.

12. An electronic device, comprising:
a single stack coupled resonator filter (CRF), adapted for single-ended to differential signal transformation, the CRF comprising:
a first film bulk acoustic resonator (FBAR) comprising a single-ended input;
a second FBAR disposed over the first FBAR comprising a first differential output and a second differential output;
an acoustic decoupling layer disposed between the first FBAR and the second FBAR; and
a resonant element comprising a resonant inductor and a parasitic capacitor connected in parallel, the resonant element being connected to the first differential output and operative to substantially balance a signal from the first differential output with a signal from the second differential output, wherein the first differential output is connected to an external circuit comprising a parasitic impedance, and the resonant inductor has an inductance selected to substantially maintain the balance.

13. An electronic device as claimed in claim 12, wherein the electronic device is one of an oscillator circuit; a mixer; or a transformer.

14. A coupled acoustic resonator adapted for single-ended to differential signal transformation, comprising a single stack, the single stack comprising:
a first film bulk acoustic resonator (FBAR) comprising a single-ended input;
a second FBAR disposed over the first FBAR comprising a first differential output and a second differential output;
an acoustic decoupling layer disposed between the first FBAR and the second FBAR; and
a resonant element comprising a resonant inductor and the parasitic capacitor connected in parallel, the resonant element being connected to the first differential output and operative to substantially balance a signal from the first differential output with a signal from the second differential output, wherein the second differential output is connected to an external circuit comprising a parasitic impedance; and the resonant inductor has an inductance selected to substantially maintain the balance.

15. A communication device, comprising:
a transmitter;
a receiver; and
a single stack coupled resonator filter (CRF), adapted for single-ended to differential signal transformation, the CRF comprising:
a first film bulk acoustic resonator (FBAR) comprising a single-ended input;
a second FBAR disposed over the first FBAR comprising a first differential output and a second differential output;
an acoustic decoupling layer disposed between the first FBAR and the second FBAR; and
a resonant element comprising a resonant inductor and a parasitic capacitor connected in parallel, the resonant element being connected to the first differential output and operative to balance substantially a signal from the first differential output with a signal from the second differential output, wherein the second differential output is connected to an external circuit comprising a parasitic impedance, and the resonant inductor has an inductance selected to substantially maintain the balance.

16. A coupled acoustic resonator adapted for single-ended to differential signal transformation, comprising a single stack, which comprises:
a first film bulk acoustic resonator (FBAR) comprising a single-ended input;
a second FBAR disposed over the first FBAR comprising a first differential output and a second differential output;
an acoustic decoupling layer disposed between the first FBAR and the second FBAR; and
a resonant element connected to the first differential output and operative to balance substantially a signal from the first differential output with a signal from the second differential output, wherein an S parameter of the signal of the first differential output and an S parameter of the signal of the second differential output have a differential of less than approximately 1.0 dB to approximately 0.3 dB.

17. A communication device, comprising:
a transmitter;
a receiver; and
a single stack coupled resonator filter (CRF), adapted for single-ended to differential signal transformation, the CRF comprising:
a first film bulk acoustic resonator (FBAR) comprising a single-ended input;
a second FBAR disposed over the first FBAR comprising a first differential output and a second differential output;
an acoustic decoupling layer disposed between the first FBAR and the second FBAR; and
a resonant element connected to the first differential output and operative to balance substantially a signal from the first differential output with a signal from the second differential output, wherein an S parameter of the signal of the first differential output and an S parameter of the signal of the second differential output have a differential of less than approximately 1.0 dB to approximately 0.3 dB.

* * * * *